US011114595B2

(12) United States Patent
Iwai et al.

(10) Patent No.: US 11,114,595 B2
(45) Date of Patent: Sep. 7, 2021

(54) OPTICAL COMPONENT AND TRANSPARENT BODY

(71) Applicant: NGK Insulators, Ltd., Nagoya (JP)

(72) Inventors: Makoto Iwai, Kasugai (JP); Iwao Ohwada, Nagoya (JP); Yoshio Kikuchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 7 days.

(21) Appl. No.: 16/591,965

(22) Filed: Oct. 3, 2019

(65) Prior Publication Data

US 2020/0035884 A1    Jan. 30, 2020

Related U.S. Application Data

(63) Continuation of application No. PCT/JP2017/022475, filed on Jun. 19, 2017.

(30) Foreign Application Priority Data

Apr. 6, 2017  (WO) .................. PCT/JP2017/014336

(51) Int. Cl.
*H01L 33/58* (2010.01)
*H01L 33/48* (2010.01)

(52) U.S. Cl.
CPC ............ *H01L 33/58* (2013.01); *H01L 33/483* (2013.01)

(58) Field of Classification Search
CPC .............................. H01L 33/58; H01L 33/483
See application file for complete search history.

(56) References Cited

U.S. PATENT DOCUMENTS

2007/0267645 A1    11/2007    Nakata et al.
2013/0043499 A1    2/2013     Ohta et al.
(Continued)

FOREIGN PATENT DOCUMENTS

JP    2007-311707 A1    11/2007
JP    2013-042079 A1    2/2013
(Continued)

OTHER PUBLICATIONS

Shoko Nagai et al., "Development of Highly Durable Deep-Ultraviolet AlGaN-based LED Multichip Array with Hemispherical Encapsulated Structures Using a Selected Resin Through a Detailed Feasibility Study," *Japanese Journal of Applied Physics*, 55 (2016), pp. 082101-1 to 082101-7.
(Continued)

*Primary Examiner* — Jay C Chang
*Assistant Examiner* — Mikka Liu
(74) *Attorney, Agent, or Firm* — Burr & Brown, PLLC

(57) ABSTRACT

The present invention relates to an optical component and a transparent body used in the optical component. The optical component includes at least one optical element that radiates ultraviolet light, and a package that accommodates the optical element. The package includes a mounting substrate on which the optical element is mounted, and a transparent body that is bonded to the mounting substrate with an organic-based adhesive layer therebetween. The package has a structure in which the ultraviolet light is transmitted through the transparent body but not guided to the adhesive layer, and the ultraviolet light does not directly come into contact with the adhesive layer.

12 Claims, 7 Drawing Sheets

(56) References Cited

U.S. PATENT DOCUMENTS

| | | |
|---|---|---|
| 2013/0234274 A1 | 9/2013 | Kam et al. |
| 2015/0372204 A1 | 12/2015 | Matsuoka et al. |
| 2016/0126426 A1 | 5/2016 | Kim et al. |
| 2016/0181479 A1 | 6/2016 | Kim et al. |
| 2016/0380168 A1 | 12/2016 | Han et al. |
| 2017/0162767 A1* | 6/2017 | Lu .......................... H01L 33/58 |
| 2017/0173892 A1* | 6/2017 | Steele ................... B22F 3/1055 |
| 2017/0338388 A1* | 11/2017 | Wu ....................... H01L 33/486 |

FOREIGN PATENT DOCUMENTS

| | | |
|---|---|---|
| JP | 2014-150094 A1 | 8/2014 |
| JP | 2014-216532 A1 | 11/2014 |
| JP | 2016-119477 A1 | 6/2016 |
| JP | 2017-011200 A1 | 1/2017 |

OTHER PUBLICATIONS

International Search Report and Written Opinion (Application No. PCT/JP2017/022475) dated Sep. 5, 2017.

English translation of International Preliminary Report on Patentability (Chapter I) (Application No. PCT/JP2017/022475) dated Oct. 17, 2019, 8 pages.

* cited by examiner

PRIOR ART

OPTICAL COMPONENT AND TRANSPARENT BODY

CROSS-REFERENCE TO RELATED APPLICATIONS

This application is a Continuation of International Application No. PCT/JP2017/022475 filed on Jun. 19, 2017, which is based upon and claims the benefit of priority from International Application No. PCT/JP2017/014336 filed on Apr. 6, 2017, the contents all of which are incorporated herein by reference.

TECHNICAL FIELD

The present invention relates to an optical component and a transparent body employed in the optical component, and relates to an optical component and a transparent body suitable being employed in, for example, an LED (light-emitting diode), an LD (semiconductor laser), or the like.

BACKGROUND ART

As shown in FIG. 6, for example, a conventional optical component 100 includes: a package 102; and an optical element 104 (for example, an LED, an LD, or the like) mounted in the package 102. The package 102 includes: a package main body 108 having formed therein a recess 106 of an upper surface opening; and a lid member 110 of, for example, a flat plate shape, joined to an upper end surface of the package main body 108. The optical element 104 is mounted on a bottom section of the recess 106 of the package main body 108. An organic-based adhesive agent 112, for example, is used in joining of the package main body 108 and the lid member 110.

Moreover, as another conventional optical component, there is, for example, the optical component described in Japanese Laid-Open Patent Publication No. 2014-216532.

SUMMARY OF INVENTION

Incidentally, due to a relationship of light distribution angles, ultraviolet light 114 from the optical element 104, in addition to including a light component emitted forward toward the lid member 110, includes a light component emitted toward the above-described joining portion. Specifically, the latter light component is guided in a peripheral section of the lid member 110 and thereby resultantly strikes the adhesive agent 112 of the above-described joining portion. An effect due to the ultraviolet light 114 (for example, UV-C) from the optical element 104 striking the organic-based adhesive agent 112, described in the document below, is that the organic-based adhesive agent 112 deteriorates due to the ultraviolet light 114. This also causes a deterioration in durability of the package 102 (a deterioration of the optical component 100).

Document: Japanese Journal of Applied Physics 55, 082101 (2016) "Development of highly durable deep-ultraviolet AlGaN-based LED multichip array with hemispherical encapsulated structures using a selected resin through a detailed feasibility study"

The above-mentioned case applies also to the optical component described in Japanese Laid-Open Patent Publication No. 2014-216532, where, as shown in FIGS. 7A-7C, a light component 114a reflected by a light-transmitting protective material 116, of ultraviolet light 114 emitted from an optical element 104 is guided into the light-transmitting protective material 116, and resultantly strikes an organic-based adhesive agent 118.

In the above-described document, there is adopted as a solution strategy for this a configuration in which an adhesive agent using a mixture of a silicone resin and a fluoropolymer is used as the organic-based adhesive agent 118. However, an adhesive agent including such a special mixture is expensive, hence there is a problem that manufacturing costs become higher priced.

The present invention has been made in view of such a problem, and has an object of providing an optical component in which by avoiding irradiation of ultraviolet light onto an organic-based adhesive agent while using a cheap organic-based adhesive agent, durability of a package can be improved, and the improvement in durability can be achieved at a low price.

In addition, the present invention has an object of providing an optical component in which light leakage from the package can be suppressed, and performance of the optical component can be improved.

[1] An optical component according to a first aspect includes: at least one optical element configured to emit ultraviolet light; and a package in which the optical element is housed, the package including: a mounting substrate on which the optical element is mounted; and a transparent body that is joined onto the mounting substrate via an organic-based adhesive layer, and the package having a structure in which the ultraviolet light is not guided to the adhesive layer through the transparent body, and the ultraviolet light does not directly strike the adhesive layer.

The package in which the optical element is housed has a structure in which the ultraviolet light is not guided to the organic-based adhesive layer through the transparent body, and the ultraviolet light does not directly strike the organic-based adhesive layer. As a result, durability of the package can be improved by avoiding irradiation of ultraviolet light onto the organic-based adhesive agent while using an inexpensive organic-based adhesive agent. That is, the optical component according to the present invention can achieve an improvement in durability at a low price.

[2] In the first aspect, the adhesive layer may be formed along a direction of a mounting surface of the mounting substrate, and the relationship of ha>hb may be satisfied where a height from the lower surface of the mounting substrate to a light emission surface of the optical element is ha, and a height from the bottom surface of the mounting substrate to the adhesive layer is hb.

As a result, since in either of face-up mounting where mounting is performed by the light emission surface of the optical element being faced onto the transparent body or flip-chip mounting where mounting is performed by the light emission surface of the optical element being faced onto the mounting substrate, the organic-based adhesive layer is not present in an emission direction of the ultraviolet light, and thus irradiation of ultraviolet light onto the organic-based adhesive agent can be avoided.

[3] In the first aspect, a sub-mount may be included on a lower surface of the optical element. As a result, by providing the sub-mount on the lower surface of the optical element, the above-mentioned magnitude relationship, that is, ha>hb can be easily satisfied, and irradiation of ultraviolet light onto the organic-based adhesive agent can be avoided.

[4] In the first aspect, the mounting substrate may have a stepped portion formed on at least a portion thereof onto which the transparent body is joined. By forming the stepped portion on at least the portion onto which the transparent body is joined, of the mounting substrate, the above-mentioned magnitude relationship, that is, ha>hb can be easily satisfied, and irradiation of ultraviolet light onto the organic-based adhesive agent can be avoided.

[5] In the first aspect, the relationship of ha S hb may be satisfied where a height from the lower surface of the mounting substrate to a light emission surface of the optical element is ha, and a height from the bottom surface of the mounting substrate to the adhesive layer is hb.

Since by disposing a light-shielding section in a housing space for the optical element as mentioned above, ultraviolet light whose angle made with the mounting surface is small, of the ultraviolet light emitted from the optical element can be shielded by the light-shielding section, the above-mentioned magnitude relationship can be set to ha hb, and a conventional proven package structure can be adopted.

[6] In the first aspect, the adhesive layer may be formed along a direction of a mounting surface of the mounting substrate, and a light-shielding section may be disposed in a housing space for the optical element, the housing space being defined by the mounting substrate and the transparent body. As a result, by disposing the light-shielding section in the housing space for the optical element, ultraviolet light whose angle made with the mounting surface is small, of the ultraviolet light emitted from the optical element can be shielded by the light-shielding section, and incidence of ultraviolet light onto the organic-based adhesive layer can be avoided.

[7] In the first aspect, the mounting substrate and the light-shielding section may be integrally formed. As a result, there is no need to use an adhesive agent when providing the light-shielding section to the mounting substrate, and durability of the package can be improved.

[8] In the first aspect, the optical element may include a plurality of optical elements that are mounted in a region surrounded by the light-shielding plate, of a mounting surface of the mounting substrate. As a result, an amount of ultraviolet light emitted from the optical component can be increased while avoiding deterioration of the package, and, moreover, since ultraviolet light can be selectively emitted from the optical elements, a variety of applications of the optical component can be handled.

[9] In the first aspect, the relationship of ha<hb may be satisfied where a height from a lower surface of the mounting substrate to a light emission surface of the optical element is ha, and a height from the lower surface of the mounting substrate to the adhesive layer is hb.

[10] In this case, a light distribution angle of the ultraviolet light emitted from the optical element is preferably less than 180°.

[11] In the first aspect, a material that does not transmit the ultraviolet light may be disposed on a surface contacting the adhesive agent, of the transparent body.

Even if some light component of the ultraviolet light emitted from the optical element is guided into the transparent body to head toward the adhesive agent, it is shielded by the material for not allowing the ultraviolet light to transmit therethrough. That is, irradiation of ultraviolet light onto the organic-based adhesive agent can be avoided. Note that the above-described material can be disposed by, for example, painting of the material, coating of the material, deposition of the material, and so on.

[12] A transparent body according to a second aspect is a transparent body employed in an optical component, the optical component being provided with a package, the package including: at least one optical element configured to emit ultraviolet light; and a mounting substrate on which the optical element is mounted. Moreover, the transparent body is joined onto the mounting substrate via an organic-based adhesive layer, and includes: a pedestal fixed onto the mounting substrate; a lens body integrally formed on the pedestal; and a recess having a lower surface opening, the recess being provided in the pedestal.

As a result, the light emission surface of the optical element mounted on the mounting substrate can be brought close to the lens body, and light leakage from the package can be suppressed. This is effective also in suppression of light leakage in the case where the optical element is flip-chip mounted.

As described above, due to the optical component according to the present invention, irradiation of ultraviolet light onto the organic-based adhesive agent is avoided while using an inexpensive organic-based adhesive agent, whereby durability of the package can be improved, and the improvement in durability can be achieved at a low price.

Due to the transparent body according to the present invention, light leakage from the package can be suppressed, and performance of the optical component can be improved.

DESCRIPTION OF EMBODIMENTS

Embodiments of an optical component according to the present invention will be described below with reference to FIGS. 1A to 5.

Figure 1A:
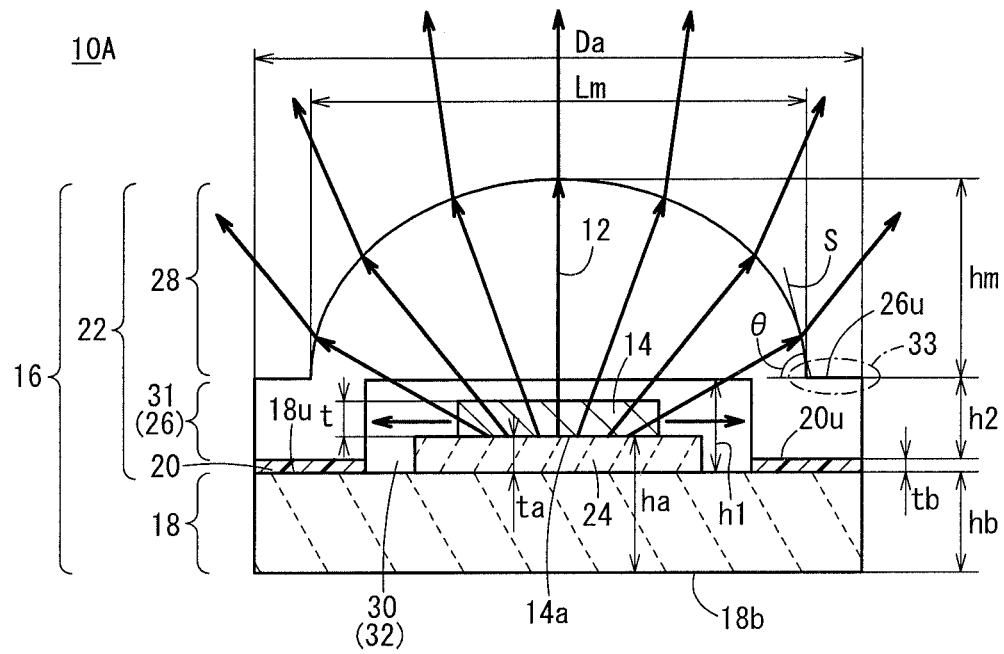
FIG. 1A is a longitudinal section view showing an optical component according to a first embodiment (a first optical component) with part thereof omitted.
Figure 1B:
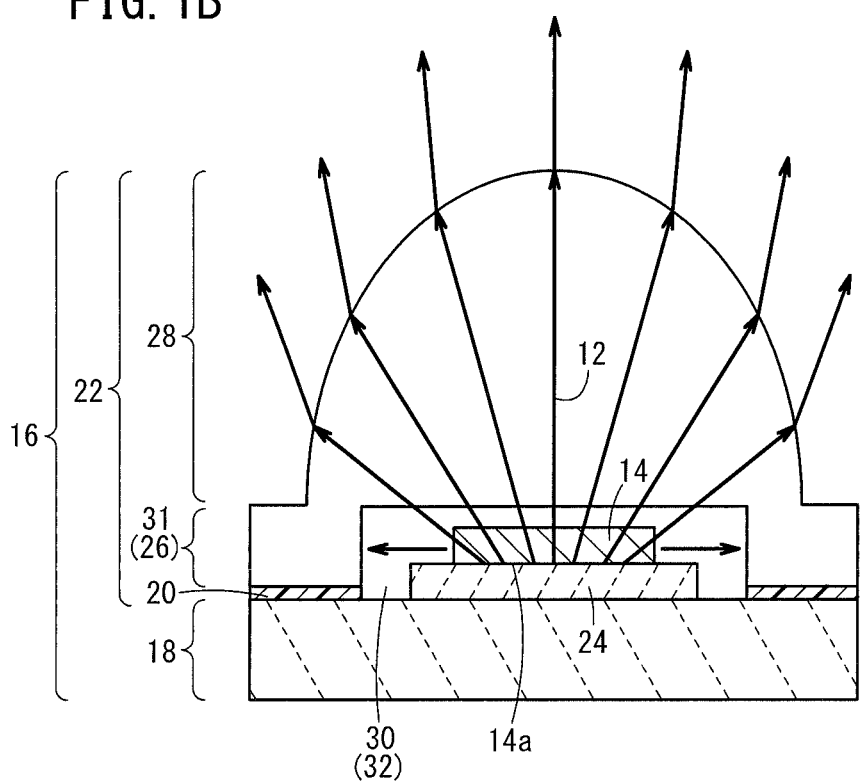
FIG. 1B is a longitudinal section view showing another example of the first optical component with part thereof omitted.

First, as shown in FIG. 1A, an optical component according to a first embodiment (hereafter, written as first optical component 10A) includes: at least one optical element 14 that emits ultraviolet light 12; and a package 16 in which the optical element 14 is housed. The package 16 includes: a mounting substrate 18 on which the optical element 14 is mounted; and a transparent body 22 joined onto the mounting substrate 18 via an organic-based adhesive layer 20. The optical element 14 is mounted on the mounting substrate 18 via a sub-mount 24. Preferably, the likes of an epoxy-based adhesive agent, a silicone-based adhesive agent, or a urethane-based adhesive agent can be used as the adhesive layer 20.

The optical element 14 is configured by GaN-based crystalline layers provided with a quantum well structure being laminated on a sapphire substrate, for example, although this is not illustrated. So-called flip-chip mounting where mounting is performed by a light emission surface 14a being faced onto the sub-mount 24, is adopted as a mounting method of the optical element 14. That is, a circuit wiring (not illustrated) formed on the mounting substrate 18 is electrically connected to a bump (not illustrated) formed on the sub-mount 24, and, moreover, a terminal (not illustrated) formed on a lower surface of the optical element 14 is electrically connected to the above-described bump, whereby the optical element 14 and the circuit wiring on the mounting substrate 18 are electrically connected.

The transparent body 22 includes: an annular peripheral wall 26 disposed so as to surround from a periphery the optical element 14 mounted on the mounting substrate 18; and a lens body 28 integrally formed on the peripheral wall 26. In addition, the transparent body 22 is provided with a housing space 30 having a lower surface opening thereof. That is, the transparent body 22 includes: a pedestal 31 fixed onto the mounting substrate 18; the lens body 28 integrally formed on the pedestal 31; and a recess 32 (the housing space 30) having the lower surface opening, the recess being provided in the pedestal 31. This housing space 30 houses at least the optical element 14. When a height of the housing space 30 is assumed to be h1, and a height of the pedestal 31 is assumed to be h2, h1 and h2 may be the same, or may differ.

A planar shape of a bottom surface of the lens body 28 is, for example, a circular shape, and an external shape of the pedestal 31 is, for example, a square shape. Of course, the planar shape of the bottom surface of the lens body 28 may be configured as an elliptical shape, a track shape, and so on, and the external shape of the pedestal 31 may be configured as a circular shape, a polygonal shape such as a rectangular shape, a triangular shape, and a hexagonal shape, and so on.

Regarding a manufacturing method of the transparent body 22 having such a shape, preferably, a powder sintering method can be adopted. For example, a molding slurry including a silica powder and organic compounds is cast in a forming mold, and after having been solidified by a chemical reaction of organic compounds with each other, for example, a chemical reaction of a dispersion medium and a hardening agent or a chemical reaction of hardening agents with each other, the solidified article is released from the forming mold and then sintered, whereby the transparent body can be manufactured.

As for dimensions of the transparent body 22, a height hc of the transparent body 22 is 0.5 to 10 mm, an outer diameter Da of the pedestal 31 is 3.0 to 10 mm, and the height h2 of the pedestal 31 is 0.2 to 1 mm. Regarding the lens body 28, a maximum length Lm of its bottom section is 2.0 to 10 mm, its maximum height hm is 0.5 to 10 mm, and its aspect ratio (hm/Lm) is 0.3 to 1.0 or the like. In this first optical component 10A, the aspect ratio of the lens body 28 is adjusted, whereby a light distribution angle of the ultraviolet light 12 emitted from the first optical component 10A is set to 90 degrees. Of course, there is no need for the light distribution angle to be limited to this, and, as shown in, for example, FIG. 1B, the aspect ratio may be increased, whereby the light distribution angle is set to, for example, 30 degrees. Of course, it may be set to another angle.

Moreover, as for dimensions of the optical element 14, a thickness t is 0.005 to 0.5 mm, an unillustrated longitudinal dimension when viewed from an upper surface is 0.5 to 2.0 mm, and an unillustrated transverse dimension when viewed from the upper surface is 0.5 to 2.0 mm. As for dimensions of the sub-mount 24, a thickness to is 0.1 to 0.5 mm, an unillustrated longitudinal dimension when viewed from an upper surface is 0.5 to 8.0 mm, and an unillustrated transverse dimension when viewed from the upper surface is 0.5 to 8.0 mm.

Due to such a configuration, in the first optical component 10A, when a height from a lower surface 18b of the mounting substrate 18 to a light emission surface 14a of the optical element 14 is assumed to be ha, and a height from the lower surface 18b of the mounting substrate 18 to the adhesive layer 20 is assumed to be hb, ha>hb.

Therefore, even if the light distribution angle of the ultraviolet light 12 emitted from the optical element 14 is 180° or more, the ultraviolet light 12 emitted in a transverse direction from the light emission surface 14a of the optical element 14 directly strikes the pedestal 31 of the transparent body 22, and never strikes the adhesive layer 20. Moreover, because an angle of a lower section of the lens body 28, that is, an angle of a tangent S of a portion rising from an upper surface 26u of the pedestal 31 (an angle θ made with the upper surface 26u of the pedestal 31) is a large angle, i.e., greater than or equal to 80° and less than 90°, the ultraviolet light 12 is not reflected downwardly, and is never led to the adhesive layer 20.

Moreover, the adhesive layer 20 is formed along an upper surface 18u (a mounting surface) of the mounting substrate 18, between the upper surface 18u of the mounting substrate 18 and a lower surface of the pedestal 31 of the transparent body 22. As a result, it becomes difficult for the ultraviolet light 12 reflected within the lens body 28 to be guided to a pedestal 31 side, and a contribution is made to suppression of deterioration of the adhesive layer 20 due to the ultraviolet light 12. Note that although FIG. 1A, and so on, show the case where a direction of the mounting surface is a horizontal direction, the direction of the mounting surface will of course be a vertical direction, and so on, depending on a placement state of the first optical component 10A.

Moreover, in the first optical component 10A, the outer diameter Da of the pedestal 31 of the transparent body 22 is extended in the transverse direction so as to be larger than the maximum length Lm of the bottom section of the lens body 28, whereby a discontinuous portion 33 (a projecting portion at a boundary of the lens body 28 and the pedestal 31) is formed on an outer surface extending from a top section to a lower surface of the transparent body 22. In this case too, it becomes difficult for the ultraviolet light 12 reflected within the lens body 28 to be guided to a pedestal 31 side, and a contribution is made to suppression of deterioration of the adhesive layer 20 due to the ultraviolet light 12.

Thus, the first optical component 10A has a structure in which the ultraviolet light 12 is not guided to the organic-based adhesive layer 20 through the transparent body 22, and the ultraviolet light 12 does not directly strike the adhesive layer 20. As a result, durability of the package 16 can be improved by avoiding irradiation of the ultraviolet light 12 onto the organic-based adhesive layer 20 while using an inexpensive organic-based adhesive layer 20. That is, the first optical component 10A can achieve the improvement in durability at a low price.

Figure 6:
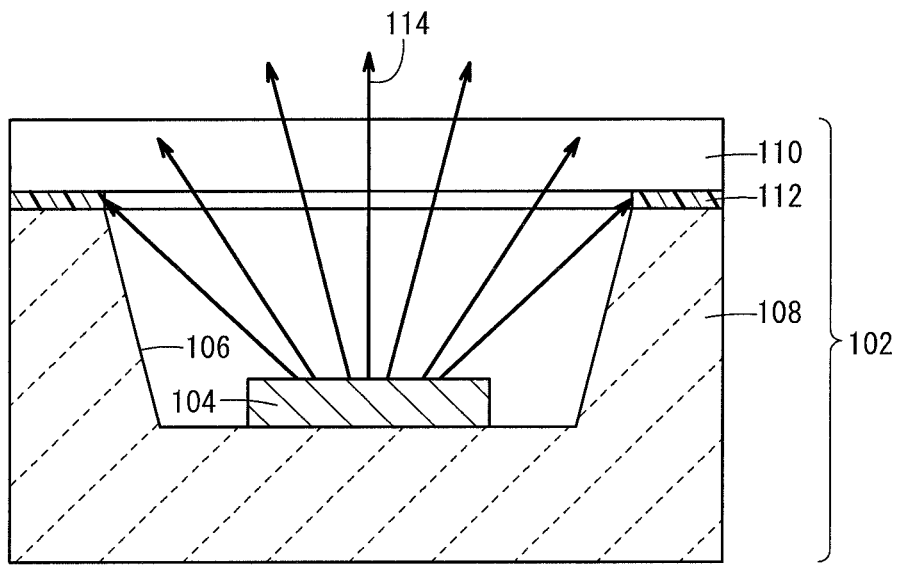
FIG. 6 is a longitudinal section view showing an optical component according to a conventional example with part thereof omitted.
Figure 7A:
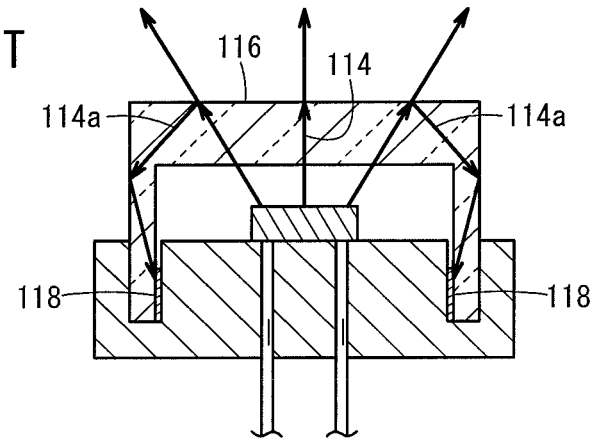
FIGS. 7A, 7B, and 7C are longitudinal section views showing optical components according to other conventional examples with part thereof omitted.
Figure 7B:
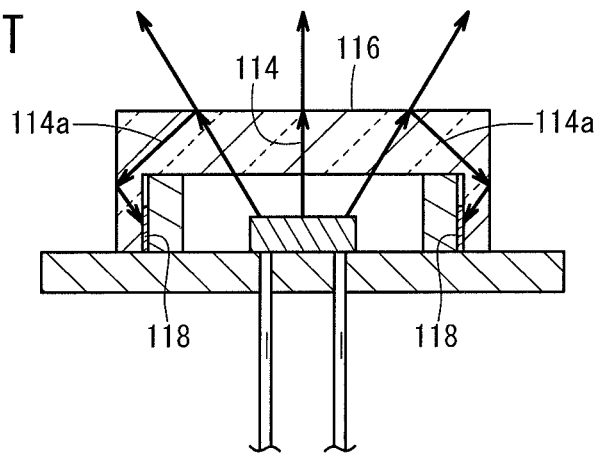
Figure 7C:
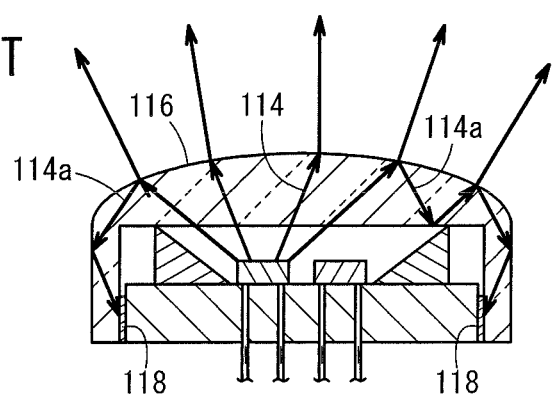

Moreover, the transparent body 22 includes: the pedestal 31 fixed onto the mounting substrate 18; the lens body 28 integrally formed on the pedestal 31; and the recess (the housing space 30) of the lower surface opening provided in the pedestal 31. Therefore, unlike a conventional optical component such as, for example, the optical component 100 of FIG. 6, the light emission surface 14a of the optical element 14 mounted on the mounting substrate 18 can be brought close to the lens body 28, and light leakage from the package 16 can be suppressed. This is effective also in suppression of light leakage in the case where the optical element 14 is flip-chip mounted.

Figure 2:
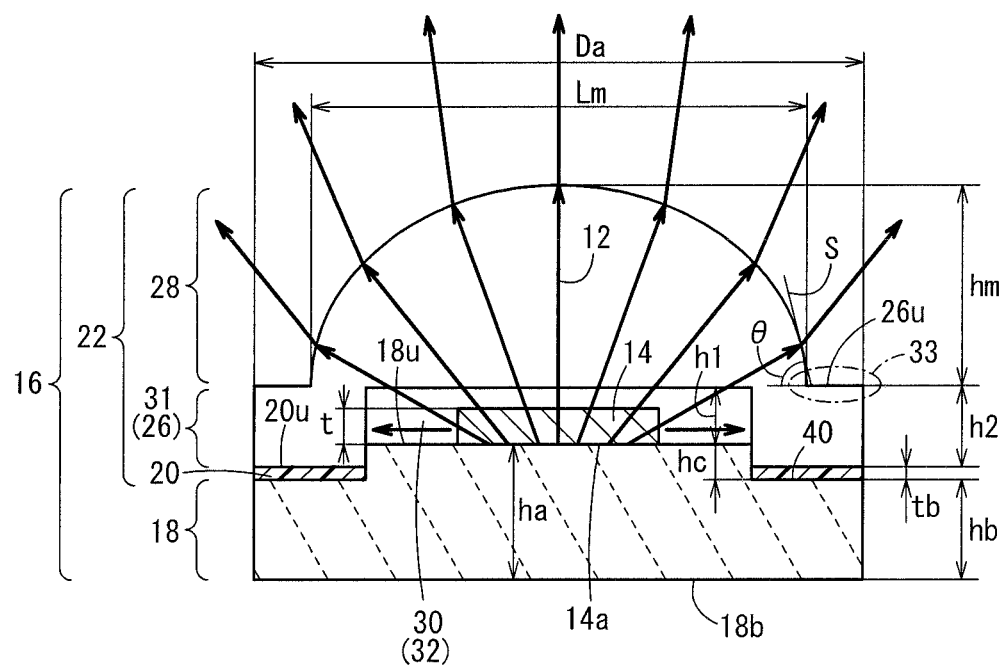
FIG. 2 is a longitudinal section view showing an optical component according to a second embodiment (a second optical component) with part thereof omitted.

Next, as shown in FIG. 2, an optical component according to a second embodiment (hereafter, written as second optical component 10B) has a configuration substantially similar to that of the above-mentioned first optical component 10A, but differs in that a stepped portion 40 is formed on at least a portion onto which the transparent body 22 is joined, of the mounting substrate 18. In this case, although a size hc of the stepped portion 40 can be arbitrarily set, it is preferably smaller than the height h2 of the pedestal 31. If the size hc of the stepped portion 40 is set to about the thickness to of the sub-mount 24 (refer to FIG. 1A), then the sub-mount 24 may be omitted, whereby the optical element 14 is directly mounted on the mounting substrate 18.

In this second optical component 10B, the above-mentioned magnitude relationship, that is, ha>hb can be easily satisfied, and irradiation of the ultraviolet light 12 onto the organic-based adhesive layer 20 can be avoided. Moreover, because the sub-mount 24 can be omitted, it is advantageous in terms of reducing manufacturing costs.

Figure 3A:
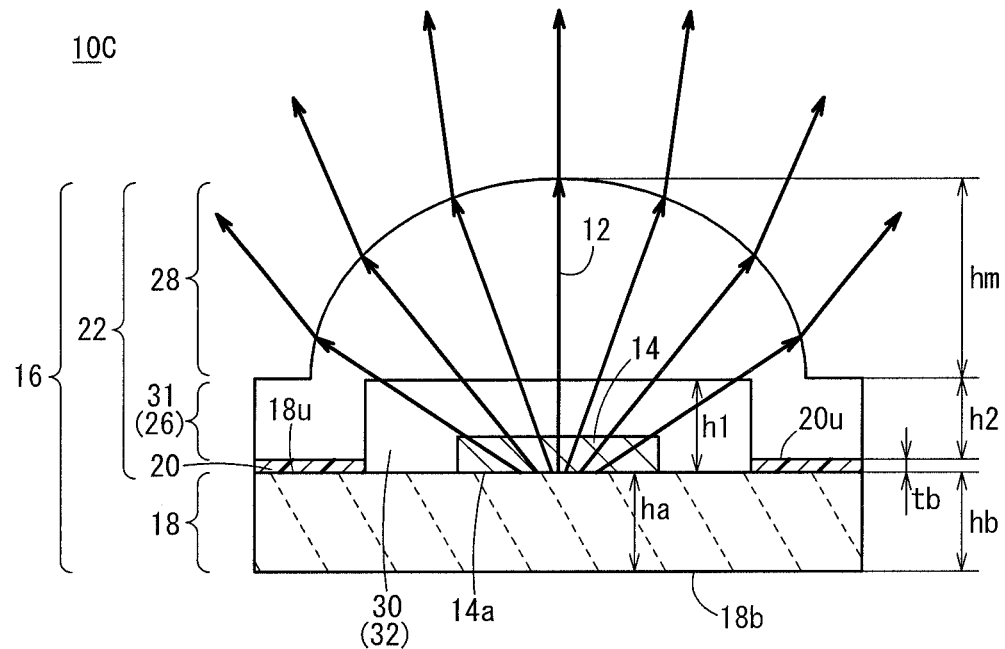
FIG. 3A is a longitudinal section view showing an optical component according to a third embodiment (a third optical component) with part thereof omitted.
Figure 3B:
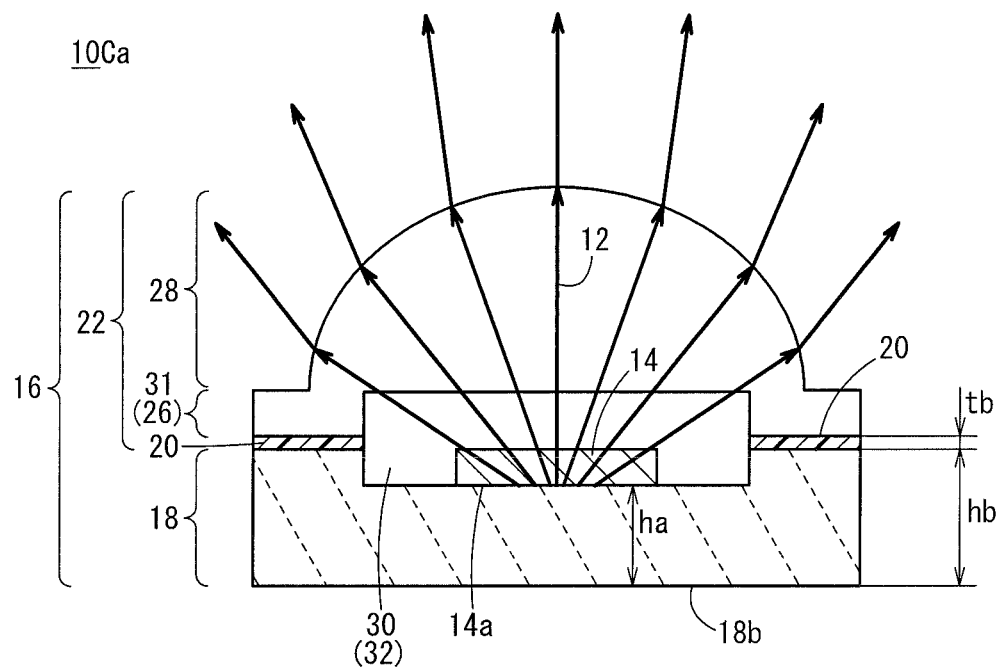
FIG. 3B is a longitudinal section view showing an optical component according to a modified example thereof with part thereof omitted.

Next, as shown in FIG. 3A, an optical component according to a third embodiment (hereafter, written as third optical component 10C) has a configuration substantially similar to that of the above-mentioned first optical component 10A, but differs in that the optical element 14 is directly mounted on the mounting substrate 18. That is, the light distribution angle of the ultraviolet light 12 emitted from the optical element 14 is less than 180°. Moreover, the height ha from the lower surface 18b of the mounting substrate 18 to the light emission surface 14a of the optical element 14 and the height hb from the lower surface 18b of the mounting substrate 18 to the adhesive layer 20 are the same.

Since the light distribution angle of the ultraviolet light 12 emitted from the optical element 14 is less than 180°, the ultraviolet light 12 emitted from the optical element 14 is not irradiated in the transverse direction (the direction along the mounting surface). Therefore, the above-mentioned height relationship can be set to ha=hb. Of course, it is also possible for the above-mentioned height relationship to be set to ha<hb, as in an optical component 10Ca according to a modified example shown in FIG. 3B, depending on the above-described light distribution angle.

Figure 4A:
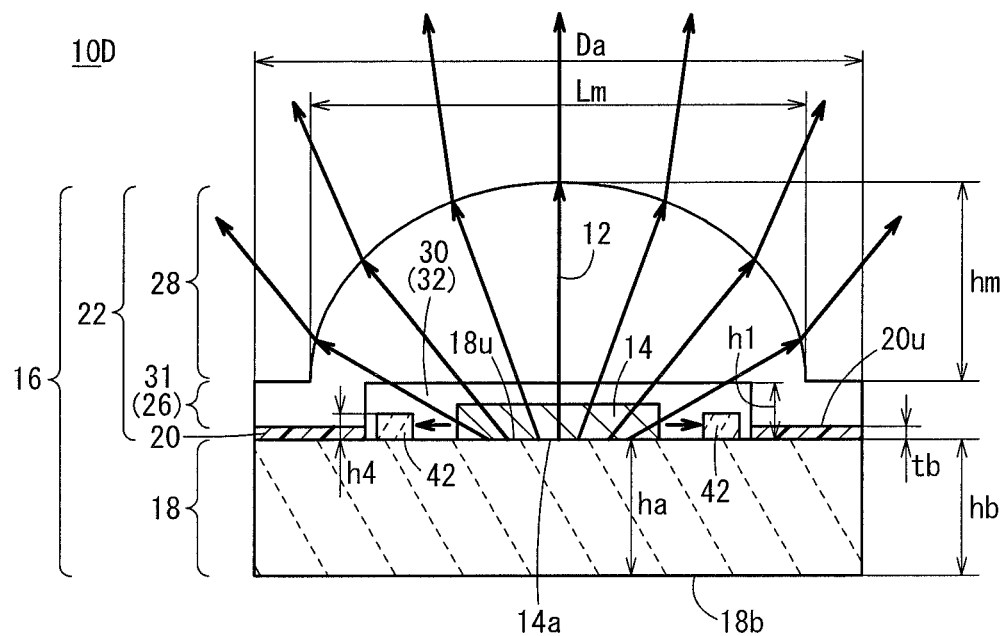
FIG. 4A is a longitudinal section view showing an optical component according to a fourth embodiment (a fourth optical component) with part thereof omitted.

Next, as shown in FIG. 4A, an optical component according to a fourth embodiment (hereafter, written as fourth optical component 10D) has a configuration substantially similar to that of the above-mentioned first optical component 10A, but differs in that the optical element 14 is directly mounted on the mounting substrate 18, and in that a light-shielding section 42 is disposed in the housing space 30 for the optical element 14 defined by the mounting substrate 18 and the transparent body 22.

Figure 4B:
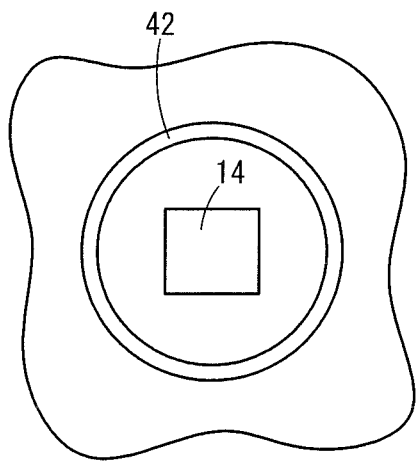
FIG. 4B is a plan view showing a state where a light-shielding section is formed around one optical element, with part thereof omitted.

A maximum height h4 of the light-shielding section 42 is preferably greater than or equal to a thickness tb of the adhesive layer 20 and less than the height h1 of the housing space 30. Moreover, although, as shown in FIG. 4B, the light-shielding section 42 is preferably formed annularly so as to surround the optical element 14 by one member, the light-shielding section 42 may be disposed annularly so as to surround the optical element 14 by a plurality of members.

By disposing the light-shielding section 42 in the housing space 30 for the optical element 14, the ultraviolet light 12 whose light distribution angle is large (the ultraviolet light 12 whose angle made with the light emission surface 14a is small), of the ultraviolet light 12 emitted from the optical element 14 can be shielded by the light-shielding section 42, and incidence of the ultraviolet light 12 onto the organic-based adhesive layer 20 can be avoided. Therefore, the above-mentioned magnitude relationship can be set to ha≤hb, preferably to ha≤hb≤(ha+h4), and it becomes possible also for a conventional proven package structure to be adopted.

Preferably, the mounting substrate 18 and the light-shielding section 42 are integrally formed. There is no need to use an adhesive agent when providing the light-shielding section 42 to the mounting substrate 18, and durability of the package 16 can be improved.

Figure 4C:
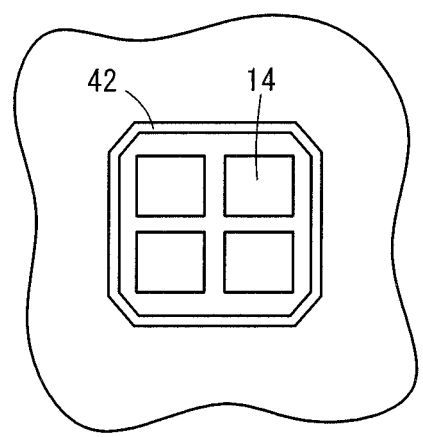
FIG. 4C is a plan view showing a state where the light-shielding section is formed around a plurality of the optical elements, with part thereof omitted.

As shown in FIG. 4C, a plurality of the optical elements 14 may be mounted in a region surrounded by the light-shielding section 42, of the mounting surface of the mounting substrate 18. An amount of the ultraviolet light 12 emitted from the fourth optical component 10D can be increased while avoiding deterioration of the package 16, and, moreover, since the ultraviolet light 12 can be selectively emitted from the optical elements 14, a variety of applications of the optical component can be handled.

Figure 5:
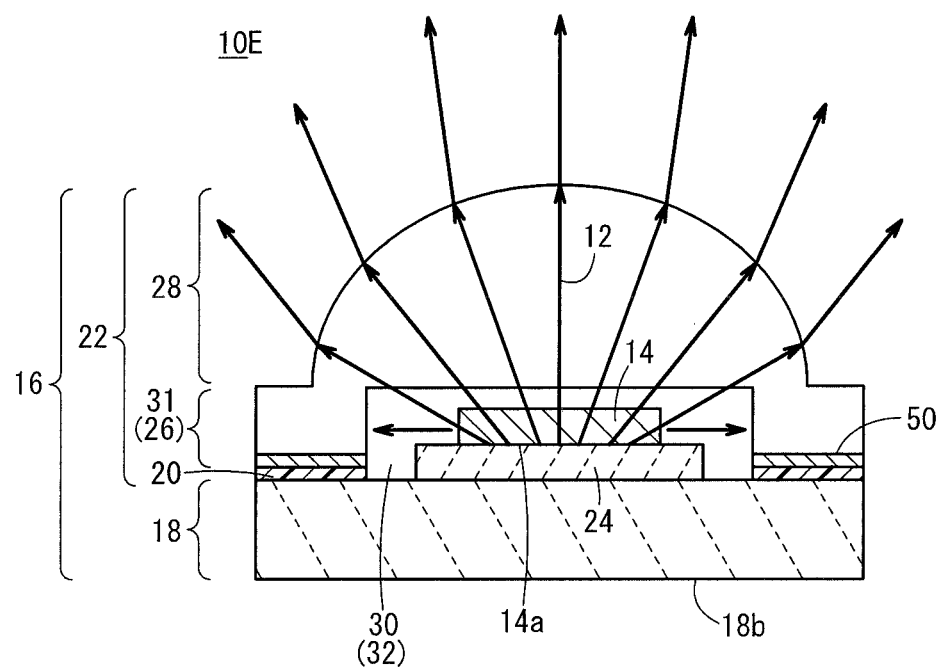
FIG. 5 is a longitudinal section view showing an optical component according to a fifth embodiment (a fifth optical component) with part thereof omitted.

Next, as shown in FIG. 5, an optical component according to a fifth embodiment (hereafter, written as fifth optical component 10E) has a configuration substantially similar to that of the above-mentioned first optical component 10A, but differs in that a film 50 made of a material through which the ultraviolet light 12 cannot be transmitted is disposed on a surface contacting the adhesive layer 20, of the transparent body 22. Preferably, materials of the film 50 may include a metal such as gold, aluminum, titanium, chromium, nickel, and so on, or a material painted with an opaque ceramics material or powder of the likes of boron nitride, aluminum nitride, alumina, and so on, or an inorganic material such as a glass that does not transmit ultraviolet region, such as low-melting-point glass, black lead, graphite, and so on.

Even if some light component of the ultraviolet light 12 emitted from the optical element 14 is guided into the transparent body 22 to head toward the adhesive layer 20, it is shielded by the film 50 made of the material not transmitting the ultraviolet light 12. That is, irradiation of the ultraviolet light 12 onto the organic-based adhesive layer 20 can be avoided. Note that for disposing of the film 50, there may be cited, for example, painting of the film 50, coating of the film 50, deposition of the film 50, and so on.

Note that the optical component according to the present invention is not limited to the above-mentioned embodiments, and that a variety of configurations may of course be adopted without departing from the essence and gist of the present invention.

The invention claimed is:
1. An optical component including:
 at least one optical element configured to emit ultraviolet light; and
 a package in which the optical element is housed, the package including:
  a mounting substrate on which the optical element is mounted; and a transparent body that is joined onto the mounting substrate via an organic-based adhesive layer, the transparent body defining a lens body including a raised pedestal provided on the adhesive layer, and the package having a structure in which the ultraviolet light is not guided to the adhesive layer through the transparent body, and the ultraviolet light does not directly strike the adhesive layer, wherein an angle θ defined between an upper surface of the pedestal and a lower section of the lens body is greater than or equal to 80 degrees and less than 90 degrees.

2. The optical component according to claim 1, wherein the adhesive layer is formed along a direction of a mounting surface of the mounting substrate, and a relationship of ha >hb is satisfied where a height from a lower surface of the mounting substrate to a light emission surface of the optical element is ha, and a height from the lower surface of the mounting substrate to the adhesive layer is hb.

3. The optical component according to claim 1, wherein a sub-mount is included on a lower surface of the optical element.

4. The optical component according to claim 1, wherein the mounting substrate has a stepped portion formed on at least a portion thereof onto which the transparent body is joined.

5. The optical component according to claim 1, wherein a relationship of ha≤hb is satisfied where a height from a lower surface of the mounting substrate to a light emission surface of the optical element is ha, and a height from the lower surface of the mounting substrate to the adhesive layer is hb.

6. The optical component according to claim 5, wherein the adhesive layer is formed along a direction of a mounting surface of the mounting substrate, and a light-shielding section is disposed in a housing space for the optical element, the housing space being defined by the mounting substrate and the transparent body.

7. The optical component according to claim 6, wherein the mounting substrate and the light-shielding section are integrally formed.

8. The optical component according to claim 6, wherein the optical element comprises a plurality of optical elements that are mounted in a region surrounded by the light-shielding section, of the mounting surface of the mounting substrate.

9. The optical component according to claim 1, wherein a relationship of ha<hb is satisfied where a height from a lower surface of the mounting substrate to a light emission surface of the optical element is ha, and a height from the lower surface of the mounting substrate to the adhesive layer is hb.

10. The optical component according to claim 9, wherein a light distribution angle of the ultraviolet light emitted from the optical element is less than 180°.

11. The optical component according to claim 1, wherein a material that does not transmit the ultraviolet light is disposed on a surface contacting the adhesive layer, of the transparent body.

12. A transparent body employed in an optical component, the optical component being provided with a package, the package including:

at least one optical element configured to emit ultraviolet light; and a mounting substrate on which the optical element is mounted, the transparent body being joined onto the mounting substrate via an organic-based adhesive layer, and the transparent body including:

a pedestal fixed onto the mounting substrate;

a lens body integrally formed on the pedestal; and a recess having a lower surface opening, the recess being provided in the pedestal, wherein an angle θ defined between an upper surface of the pedestal and a lower surface of the lens body is greater than or equal to 80 degrees and less than 90 degrees.

* * * * *